United States Patent [19]

Morita et al.

[11] Patent Number: 4,468,853

[45] Date of Patent: Sep. 4, 1984

[54] METHOD OF MANUFACTURING A SOLAR CELL

[75] Inventors: Hiroshi Morita, Kanagawa; Taketoshi Kato, Tokyo; Hiroshi Washida, Kanagawa; Akira Onoe, Tokyo, all of Japan

[73] Assignee: Tokyo Shibaura Denki Kabushiki Kaisha, Kanagawa, Japan

[21] Appl. No.: 489,384

[22] Filed: Apr. 28, 1983

[30] Foreign Application Priority Data

May 13, 1982 [JP] Japan ................................. 57-79105

[51] Int. Cl.³ ........................................... H01L 31/18
[52] U.S. Cl. ..................................... 29/572; 148/1.5; 148/188; 136/256; 136/261; 427/74; 427/53.1
[58] Field of Search ................... 29/572; 148/1.5, 188; 136/261, 256; 427/74, 53.1

[56] References Cited

U.S. PATENT DOCUMENTS 4,273,950 6/1981 Chitre ................................. 136/255

OTHER PUBLICATIONS

J. S. Katzeff et al., "Laser Processing of Silicon Solar Cells", *Conf. Record, 15th IEEE Photovoltaic Specialists Conf.* (1981), pp. 437-441.
J. C. C. Fan et al., "A New Technique For Preparing P-N Junctions For Si Solar Cells", *Conf. Record, 15th IEEE Photovoltaic Specialists Conf.* (1981), pp. 432-436.
R. T. Young et al., "Laser Techniques In Photovoltaic Applications", *SPIE*, vol. 198, Laser Applications In Materials Processing, pp. 36-41 (1979).
E. Fogarassy et al., "Silicon Solar Cells Realized By Laser Induced Diffusion of Vacuum-Deposited Dopants", *J. Appl. Phys.*, vol. 52, pp. 1076-1082 (1981).
J. L. Borowitz et al., "Doping of Silicon By Laser-Induced Diffusion", *Proceedings, 3rd E.C. Photovoltaic Solar Energy Conf. (1980)*, Reidel Pub. Co. (1981), pp. 635-638.
E. Fogarassy et al., "Solar Cells Realized By Laser Induced Diffusion of Dopants Deposited on Silicon Surface", *Proceedings, 3rd E.C. Photovoltaic Solar Energy Conf. (1980)*, Reidel Pub. Co. (1981), pp. 639-645.

*Primary Examiner*—Aaron Weisstuch
*Attorney, Agent, or Firm*—Cushman, Darby and Cushman

[57] ABSTRACT

A method of making a solar cell has the following steps: (1) Formation of a surface layer including a dopant on a silicon substrate wherein the surface layer has a higher laser absorption index than the silicon substrate. (2) Irradiation by laser of the surface layer to form a junction in the silicon substrate.

12 Claims, 18 Drawing Figures

METHOD OF MANUFACTURING A SOLAR CELL

BACKGROUND OF THE INVENTION

The present invention relates in general to methods of manufacturing a solar cell.

In a conventional method of making a solar cell, particularly making a p-n junction in a p type silicon substrate, the p-n junction is formed by diffusing phosphorus into a surface region of the silicon substrate by a thermal diffusion method. To form the p-n junction, a heat treatment of more than 850° is required. However, such a heat treatment causes heat damage to the silicon substrate. This results in a significant decrease in the lifetime of minority carriers, which is a very important parameter of a silicon semiconductor relating to its operating efficiency. With a significant decrease in minority carrier lifetime, a semiconductor device of high performance cannot be obtained.

Recently, there has been active research in the ion implantation method, which is one technique for forming a semiconductor junction without the use of thermal diffusion. In the ion implantation method, the degradation of minority carrier lifetime is less than the degradation associated with the heat diffusion method. However, the ion implantation approach has a different drawback. The crystallographic structure of an ion implanted layer is disturbed and the implanted ion is not adequately activated. This prevents obtaining satisfactory characteristics of the semiconductor device produced with the ion implantation method. The semiconductor substrate must be annealed to overcome this deficiency associated with ion implantation.

There are two annealing processes: one is furnace annealing and the other is laser annealing. The ion implantation method cannot provide a high quality semiconductor device without utilizing either the furnace annealing process alone or a combination of both furnace and laser annealing. Because of the annealing requirement associated with ion implantation, minority carrier lifetime is decreased undesirably. At the present state of the art, a combination of ion implantation and laser annealing is not available to produce solar cells. Further, ion implantation requires a relatively large apparatus and the amount of semiconductor substrate that can be treated within a predetermined period of time is relatively small for solar cell production. This would make such an approach cost inefficient.

Therefore, it is highly desirable in the solar cell industry to provide a method of making a semiconductor junction that would not significantly decrease minority carrier lifetime, while at the same time permit the production of a low cost semiconductor device.

SUMMARY OF THE INVENTION

Therefore, the present invention provides a novel method of making a solar cell that overcomes the disadvantages attendant known methods as discussed above.

A surface layer including a dopant is formed on a silicon substrate. The surface layer has a higher laser absorption index than that of the silicon substrate so that the surface layer can be heated efficiently by laser radiation applied to it. After the surface layer is formed, it is irradiated by a laser, causing it to be heated locally and to form a junction.

BRIEF DESCRIPTION OF THE DRAWINGS

The invention will be described in detail with reference to the accompanying drawings, wherein.

DETAILED DESCRIPTION OF THE PREFERRED EMBODIMENTS

Figure 1:
FIGS. 1, 2, 3, 4 and 5 are cross-sectional views of a solar cell showing the production steps according to a first embodiment of the present invention.

As presently conceived, the invention has particular practical application to the production of solar cells. Therefore, it will be described in terms of solar cell production. However, it has applicability to the production of junctions in other types of semiconductor devices. The present invention utilizes a laser beam for forming a junction without decreasing the lifetime of minority carriers in a silicon substrate. It is essential to form a surface layer to be heated on the substrate. The surface layer is required to meet the following criteria:

(a) The surface layer has to contain impurities, such as from a dopant, which can be either the same or a different conductivity type as that of the silicon substrate, so as to form a junction therein.

(b) The surface layer has to be formed of a material having a high laser absorption index so that it can be heated locally and effectively by a laser beam. Therefore the surface layer is preferably made of high laser absorption index material containing impurities. When a low laser absorption index material layer containing impurities is used, a layer of high laser absorption index material must be added below the low laser absorption index material next to the substrate. Amorphous silicon is preferable as a high laser absorption index material, because its laser absorption index is about one order of magnitude higher than that of single crystalline silicon. Doped amorphous silicon is formed on the silicon substrate as a surface layer. After that, a laser beam is scanned on the surface layer to form a junction in the silicon substrate.

It is also effective to laminate another undoped amorphous silicon layer to prevent the substrate from being contaminated or to improve laser absorption. Amorphous silicon, germanium, amorphous selenide, amorphous telluride or their composite materials can be used as the high laser absorption material. The wavelength of the laser beam is preferably within a range of 0.2 $\mu$m to 0.8 $\mu$m in view of the laser absorption index of the above materials. In this range, amorphous silicon has a larger laser absorption index than silicon substrate. Preferably the laser is, for example, a ruby laser (0.69 $\mu$m), an Ar laser (0.5 $\mu$m), an excimer laser (0.24 $\mu$m), or an Alexandrite laser (0.75 $\mu$m). A second harmonic of a fundamental wave can be utilized and a Nd:YAG laser (1.06 $\mu$m) is also preferable.

After forming the surface layer, it is laser irradiated to form a junction. Then, front and back electrodes are formed to complete the solar cell. If necessary, an antireflection layer can be added. The formation of a junction by laser irradiation is also effective to form a high density impurity layer on the back surface of the substrate, which high density impurity layer is the same conductivity type as the substrate thereby to collect carriers, generated near the back surface, by means of an internal field. This effect is called the "back surface field" effect.

Generally a solar cell is evaluated in terms of conversion efficiency. A central concept of the present invention will be explained with reference to an experiment conducted by the inventors. This concept is that the substrate doped with impurities provides longer minority carrier lifetime after laser irradiation than after conventional furnace heat treatment of a substrate. In the conventional method, a p+ layer is formed on an n-type silicon substrate by depositing phosphorus from a source of $POCl_3$. The phosphorus is driven in by baking in a furnace at 850° C. to 900° C. for an hour. This decreases the minority carrier lifetime remarkably. For example, a wafer having a 60 μsec lifetime initially is decreased to 10-20 μsec by the heat treatment. The lifetime is measured in a conventional manner. An electron-hole pair is generated in the substrate by laser radiation from a laser diode, and microwaves are irradiated on the substrate. The reflection intensity of the microwaves as a function of conductivity is measured from an attenuation curve of microwave reflection intensity.

The substrate having a junction formed by depositing a boron containing glass on a p-type silicon substrate and sintering, and a substrate having a junction formed by depositing a phosphorus glass on an n-type silicon substrate and sintering experienced a decrease in minority carrier lifetime of 10-50% of their initial levels.

By comparison, the substrate formed by depositing a surface layer and heating the surface layer by laser has a 50-60 μsec minority carrier lifetime, which is the same as that which existed before laser treatment.

The result of this experiment shows that laser irradiation should be employed as an alternative to furnace treatment for enhancing the characteristics of a solar cell.

Embodiment 1

Figure 2:
Figure 3:
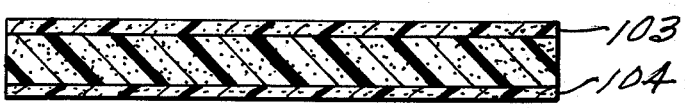
Figure 4:
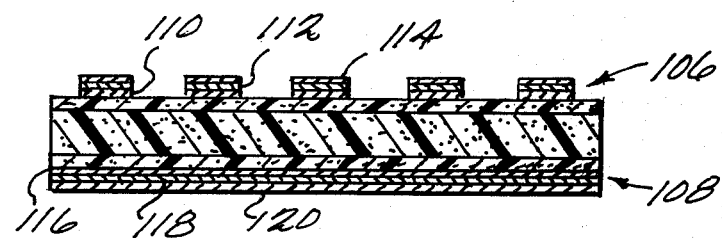
Figure 5:
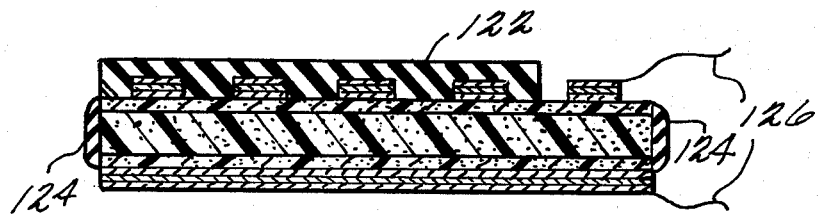

FIGS. 1, 2, 3, 4 and 5 show cross-sectional views of a solar cell formed in accordance with the production steps of a first embodiment of the present invention. A p-type silicon substrate 100 formed by the float zone (FZ) method and of 1 Ωcm specific resistance was prepared. Substrate 100 is 250 μm in thickness and has a minority carrier lifetime of 60 μsec. Substrate 100 was polished on both of its surfaces. After cleaning the substrate, an amorphous silicon layer 102 was formed on one surface of the substrate. Amorphous silicon layer 102 was formed by a glow discharge method using a reaction gas containing 10% $H_2$ and $SiH_4$ doped with $PH_3$ ($PH_3/SiH_4 = 10^{-2}$) while the substrate was held at 270° C. Layer 102 was formed to a thickness of 4000 Å. Then a Nd:YAG laser beam irradiated the amorphous silicon layer to melt it. A second harmonic (5300 Å) was utilized with an energy density of 5J/cm$^2$ and a scanning speed of 60 mm/sec. The molten amorphous silicon was single crystallized and formed an n+ layer 103 as shown in FIG. 2. The surface impurity density was $2 \times 10^{20}/cm^3$ and the junction depth was 0.6 μm. Next, an aluminum layer was formed on the other surface of the silicon substrate. An aluminum evaporation source of 99.99% purity was bombarded by an accelerated electron beam of 0.2 A and 3 kV acceleration voltage in a vacuum chamber at a pressure of less than $1 \times 10^{-5}$ Torr. Evaporated aluminum was thus deposited on the silicon substrate provided in the same vacuum chamber. This method is called "electron beam evaporation". The substrate was held at 300° C. during the depositing. The depositing speed was 3000 Å/min and a 10 μm thick aluminum layer was formed. Then, a laser beam was irradiated on the aluminum layer to heat near the interface between the aluminum layer and the silicon substrate and to form a p+ layer 104 (see FIG. 3). This laser irradiation was carried out by a Nd:YAG laser having a wavelength of 1.06 μm, an energy density of 6 J/cm$^2$, and a beam scanning speed of 11.5 mm/sec. Then excess aluminum was removed with a hydrogen fluoride and hydrogen chloride mixture to expose p+ layer 104. Next, a front electrode 106 and a back electrode 108 were formed as shown in FIG. 4. Sequential vacuum evaporation and photoetching resulted in formation of grid like front electrode 106 of three metal lamination layers. Front electrode 106 was formed from a titanium layer 110 of 1000 Å thickness, a palladium layer 112 of 500 Å thickness and a silver layer 114 of 25 μm thickness. Back electrode 108 was formed by sequential vacuum evaporation of titanium, palladium, and silver over the back surface of the substrate. Back electrode 108 was constituted of titanium layer 116 of 1000 Å thickness, palladium layer 118 of 500 Å thickness and silver layer 120 of 10 μm thickness (see FIG. 4). An antireflection layer 122 of $Ta_2O_5$ of 700 Å thickness was formed by a sputtering method on the front electrode except over a portion to be connected with a lead wire in order to reduce light reflection on the surface of the substrate. Then, a diffusion layer near the edge of the substrate was removed and an encapsulation layer 124 was formed on the edge of the substrate and lead wires 126 were applied (see FIG. 5).

A solar cell formed by this method was evaluated by a solar simulator. The test condition was AM1 and a pseudo sun light of 100 mW/cm$^2$ was radiated on the surface of the solar cell. An open circuit voltage of 0.6 V, a short circuit current of 36 mA/cm$^2$ and conversion efficiency of 16.5% were obtained with this solar cell. A conventional solar cell formed by a high temperature process, such as the furnace anneal or the furnace diffusion process, and having the same structure as this embodiment, showed a conversion efficiency of 14.8%. The lifetime of minority carriers of the conventional solar cell was 15 μsec, but using the method of this invention, a minority carrier lifetime of 56 μsec was achieved. The difference in lifetime is thought to contribute to the cell's high conversion efficiency. According to this embodiment, a heat treatment of high temperature and long time is not required, so that the solar cell can be made at low cost because of simpler manufacturing apparatus and reduced labor time.

Embodiment 2

Figure 6:
FIGS. 6, 7, 8, 9, 10 and 11 are cross-sectional views of a solar cell showing the production steps according to an alternative embodiment.
Figure 7:
Figure 8:
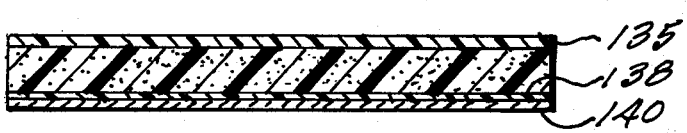
Figure 9:
Figure 10:
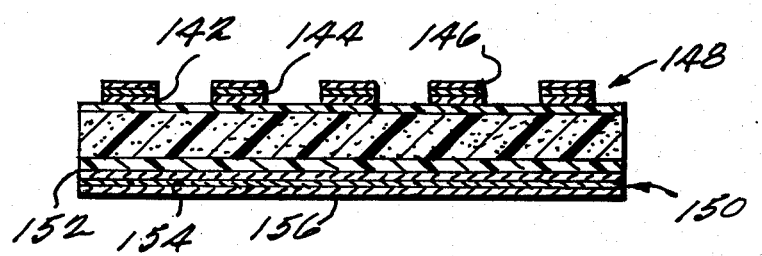
Figure 11:
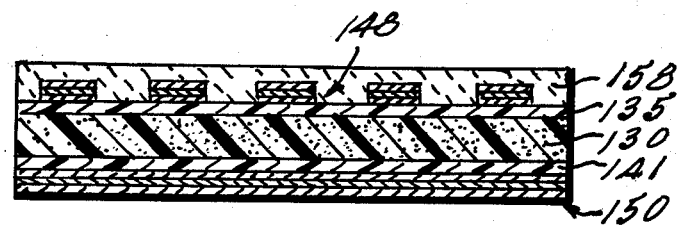

Referring to FIG. 6, a boron doped (Czochralski) single crystal wafer 130 of orientation (111), 200 μm thickness, 10 Ωcm specific resistance and 62 μsec minority carrier lifetime was prepared. Its diameter was 4 inches and both surfaces were polished. After cleaning the substrate 130, a surface layer 132 (to become an n+ layer) was formed on the substrate. Layer 132 of amorphous silicon doped with phosphorus was deposited on the substrate to form the same type surface layer as in example 1. An undoped amorphous silicon layer 134 was then formed on amorphous silicon layer 132 to increase laser absorption and to protect amorphous silicon layer 132 from contamination. That is, the first phosphorus doped amorphous silicon layer 132 of 4000 Å thickness was formed on the substrate from a gas ($SiH_4:PH_3=100:1$) by a glow discharge method. Then, undoped amorphous silicon layer 134 of 4000 Å thickness was formed from $SiH_4$ gas without $PH_3$. In each case the reaction gas contained 10% (by pressure) $H_2$ and the substrate was kept at 300° C. After forming amorphous silicon layers 132 and 134, the layers were irradiated by a laser beam. The laser radiation was from a ruby laser and the energy density was 1.5 $J/cm^2$. The laser beam was scanned on the amorphous silicon layer 134 by a galvanometer mirror scanner to form n+ layer 135 and n+p junction 136 (see FIG. 7). Next, boron doped and undoped amorphous silicon layers 138 and 140, respectively, were formed on the rear surface of the substrate similar to layers 132 and 134 on the front surface. The boron doped layer 138 was formed from $H_2$ based reaction gas including $B_2H_6$ and $SiH_4$($B_2H_6$/$SiH_4=10^{-2}$). An argon laser irradiated the amorphous silicon layers 138 and 140 to form a p+ layer 141 (see FIG. 9). Titanium layer 142 of 800 Å thickness, platinum layer 144 of 500 Å thickness, and silver layer 146 of 25 $\mu$m thickness were sequentially evaporated on the front surface of the substrate through a stainless mask to form a grid like front electrode 148. A back electrode 150 was formed by evaporating titanium layer 152 of 800 Å thickness, platinum layer 154 of 500 Å thickness, and silver layer 156 of 10 $\mu$m thickness (see FIG. 10). Then an antireflection layer 158 of silicon nitride of 700 Å thickness was formed on the front surface of the substrate by a plasma CVD method. After that, a diffusion layer near the periphery of the substrate was removed with mixture of hydrogen fluoride and hydrogen chloride (see FIG. 11). The solar cell was evaluated by a solar simulator of AM1 and 100 $mW/cm^2$ pseudo sunlight. The conversion efficiency was 15.6%. The lifetime of minority carriers was 60 $\mu$sec, almost the same as initial figure.

Embodiment 3

Figure 12:
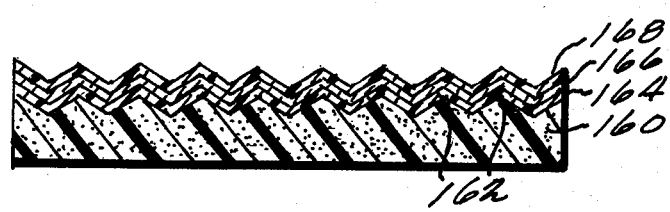
FIGS. 12, 13 and 14 are cross-sectional views of another solar cell showing another alternative embodiment of the present invention.

Referring to FIG. 12, a boron doped p-type Cz single crystal wafer 160 was prepared. The wafer was (111) in orientation, 300 $\mu$m in thickness, 5 $\Omega$cm in specific resistance and 70 $\mu$sec in minority carrier lifetime. The wafer diameter was 4 inches, and the sliced surface was etched and texturized. A texture etching was performed to reduce the light reflection on the surface, and the surface has a plurality of pyramid-like projections 162 and the width dimension of projection 162 a few $\mu$m. The texturized surface was formed as follows. The wafer was dipped into a 30% NaOH solution at 110° C. for 1.5 minutes to etch the surface. Then the wafer was etched in a mixture of a 2% NaOH solution and isopropyl alcohol, the mixing ratio of former to latter being 4:1. The mixture was heated to 80° C. and etching was conducted for 55 minutes. The temperature and quantity of etchant were adequately controlled to etch under constant conditions. These etching steps texturized both surfaces of the substrate. To stop the etching and to remove remaining alkali from the surface of the substrate, the substrate was dipped in a hydrochloric acid solution for 1 minute, and then washed with flowing pure water for 15 minutes. Next, the water was replaced by acetone and the substrate was dried. The resultant substrate had pyramid-like projections 162, which had a width dimension of a few $\mu$m and a height of a few $\mu$m. Projections 162 were formed over the surface of the substrate and the reflection ratio was decreased. Then an amorphous silicon layer 164 of 2000 Å thickness was formed on the wafer by a magnetron sputtering method. Polycrystalline silicon was used as the target and the sputtering gas contained argon and hydrogen. Hydrogen constituted 10% of total and the sputtering gas pressure was $2\times10^{-3}$ Torr. The substrate was at room temperature during sputtering. After that, a phosphorus glass layer 166 of 8000 Å thickness was formed on the amorphous silicon layer 164 by a low pressure chemical vapor deposition (CVD) method during which the substrate was kept at 300° C. The reaction gas included $SiH_4$ and $PH_3$ with $N_2$ as a diluent. Further, an amorphous silicon layer 168 of 2000 Å thickness was formed on the phosphorus glass layer by a magnetron sputtering method (see FIG. 12).

Figure 13:

In this case, even though phosphorus glass layer 164 seldom absorbs the laser beam, the glass layer was sandwiched by amorphous silicon layers 164 and 168 and these layers can be heated by laser irradiation. Phosphorus in the glass layer was diffused into lower amorphous silicon layer 164 and an n+ layer was formed by laser irradiation. An excimer laser was used and the energy density was 1 $J/cm^2$. After laser irradiation, the top amorphous silicon layer 168 and glass layer 166 were removed by hydrogen fluoride and n+ layer 170 was left (see FIG. 13). A boron containing layer was then deposited on the rear surface in a thickness of 1000 Å. The boron layer was heated by an excimer laser to form a p+ layer 172 as shown in FIG. 13.

Figure 14:
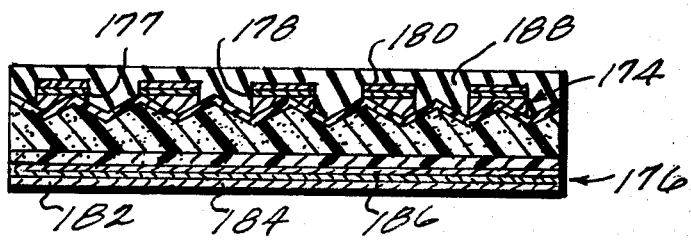

Then a front electrode 174 and a back electrode 176 were formed. Front electrode 174 included titanium layer 77 of 1000 Å thickness, palladium layer 178 of 500 Å thickness and silver layer 180 of 30 $\mu$m thickness. Titanium and palladium layers 177 and 178 were formed by evaporating through masks and silver layer 180 was formed by electroplating. Back electrode 176 included titanium layer 182 of 1000 Å thickness, palladium layer 184 of 500 Å thickness formed by evaporation and silver layer 186 of 10 $\mu$m thickness formed by electroplating. On the front electrode, $TiO_2$ layer 188 of 650 Å thickness was formed as an antireflection layer (see FIG. 14).

This solar cell was evaluated with pseudo sunlight of AM1 and 100 $mW/cm^2$. The conversion efficiency was 14.9%. The lifetime of minority carriers was 65 $\mu$sec.

Embodiment 4

Figure 15:
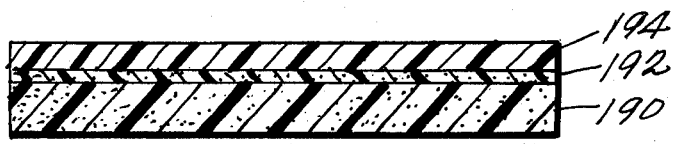
FIGS. 15, 16, 17 and 18 show cross-sectional views of another solar cell illustrating a further alternative embodiment of the present invention.

Referring now to FIG. 15, a Cz single crystal substrate 190 of orientation (111), 3 $\Omega$cm specific resistance, 250 $\mu$m in thickness and 55 $\mu$sec in minority carrier lifetime was prepared. A surface layer 192 of amorphous silicon of 2000 Å thickness was formed on the substrate by evaporation. Then an alcohol solution of ester silicate including 0.65 mol/l of $P_2O_5$ was coated on the surface layer by a spin coating technique. The coated layer 194 was dried at 100° C. Then a laser beam was irradiated on the coated layer. An alexandrite laser was used. Even though coating layer 194 was low in absorption of the laser beam, amorphous silicon layer 192 was heated adequately and melted and then single crystallized. When the amorphous silicon layer 192 was melted and single crystallized, phosphorus was absorbed and diffused into the amorphous silicon layer 192 and n+ layer 195 was formed. During this laser heating, the coated layer 194 was also heated indirectly and transformed into a stable antireflection layer 197

Figure 16:
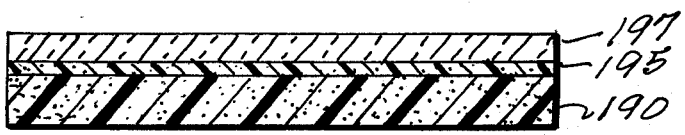
Figure 17:
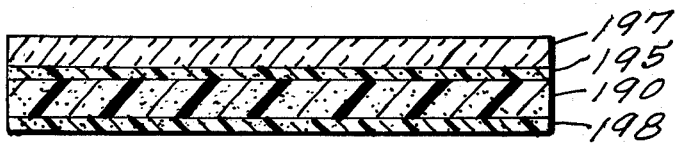
Figure 18:
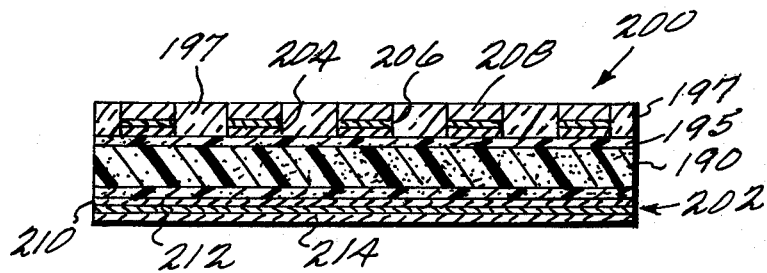

(see FIG. 16). Next, an aluminum paste was printed on the rear surface and dried at 120° C. Then the printed layer was irradiated by a Nd:YAG laser and Al-Si alloy layer 198 of p+ type was formed. Excess aluminum was removed by etching (see FIG. 17). Then a photoresist was coated on the front surface of the substrate, exposed to light through a photo mask and developed to form openings in the photoresist to be formed into a front electrode. Then the portions of antireflection layer 197 exposed through the openings in the photoresist were etched with hydrogen fluoride. A front electrode 200 and a back electrode 202 were then formed by sequential electroless nickel plating, electro copper plating and electroless nickel plating. Each electrode was 20 μm to 30 μm in thickness. Then the remaining photoresist was removed from the substrate to yield a solar cell (see FIG. 18). Numerals 204, 206 and 208 denote the nickel layer, copper layer and nickel layer, respectively. Numerals 210, 212 and 214 also denote a nickel layer, copper layer and nickel layer, respectively.

This solar cell indicated a 52 μsec minority carrier lifetime and 15.0% conversion efficiency under the irradiation of AM1, 100 mW/cm$^2$ sunlight.

In this embodiment amorphous silicon was used as a laser absorption layer; however another material having a higher laser absorption ratio than that of silicon substrate can be used.

According to the present invention, the silicon substrate cannot be excessively heated; therefore the lifetime of minority carriers does not decrease remarkably and a high performance semiconductor device is obtained. Further, the requirement for apparatus providing high temperature conditions for a lengthy diffusion step is eliminated, and therefore a solar cell can be manufactured at a low cost.

While the invention has been described in connection with what is presently contemplated to be the preferred embodiments, it is to be understood that the invention has broader applicability and that the claims should be construed as broadly as possible to cover the alternative embodiments.

We claim:

1. A method of manufacturing a solar cell comprising the steps of:
    providing a silicon substrate of a first conductivity type;
    forming a first amorphous silicon layer including a dopant on said silicon substrate;
    forming a second amorphous silicon layer without dopant on said first amorphous silicon layer; and
    laser beam irradiating said second layer to cause the formation of a junction with said silicon substrate.

2. A method of manufacturing a solar cell comprising the steps of:
    providing a silicon substrate of a first conductivity type;
    forming an undoped amorphous silicon layer on said silicon substrate;
    forming a layer including a dopant on said first amorphous silicon layer, said layer being of a lower laser absorption index than that of said first amorphous layer; and
    laser beam irradiating the dopant containing layer to cause the formation of a junction with said silicon substrate.

3. A method of manufacturing a solar cell comprising the steps of:
    providing a boron-doped p-type substrate having first and second major surfaces;
    providing a first front side n-doped amorphous silicon layer on the first surface of the substrate;
    providing a second front side non-doped amorphous silicon layer over the first doped amorphous silicon layer to increase laser absorption and to protect the first doped amorphous silicon layer from contamination;
    first laser beam irradiating the first and second amorphous layers to form an n+ layer and create a semiconductor junction with said substrate;
    forming a first backside boron doped layer on said second surface of the substrate;
    forming a second backside non-doped layer over said first backside boron-doped layer;
    second laser beam irradiating the backside boron-doped and non-doped layers to form a p+ layer;
    providing a front electrode on the n+ layer;
    providing a back electrode on the p+ layer.

4. A method according to claim 3, wherein said step of providing a first doped amorphous layer comprises the step of providing said layer by a glow discharge method.

5. A method according to claim 3, wherein said step of first laser beam irradiating comprises the step of irradiating with a Ruby laser.

6. A method according to claim 3, wherein said step of second laser irradiating comprises the step of irradiating with an argon laser.

7. A method according to claim 3 further comrising the step of adding an antireflection layer over at least a portion of the n+ layer.

8. A method of manufacturing a solar cell comprising the steps of:
    providing a p-type boron doped silicon substrate having first and second major surfaces;
    etching the first surface of the substrate to reduce light reflection on the first surface by forming a plurality of pyramid-like projections;
    forming a first amorphous silicon layer on the etched surface of the silicon substrate;
    forming a phosphorus glass layer on the amorphous silicon layer;
    forming a second amorphous silicon layer on the phosphorus glass layer so that the glass layer is sandwiched between said amorphous silicon layers;
    laser beam irradiating the first and second amorphous silicon layers and the phosphorus glass layer to diffuse phosphorus into the first amorphous silicon layer thereby forming an n+ layer and a semiconductor junction with the substrate;
    removing the second amorphous silicon layer and the phosphorus glass layer;
    depositing a boron doped layer onto the second surface of the substrate;
    second laser beam irradiating the boron doped layer to form a p+ layer;
    providing a front electrode on the n+ layer; and
    providing a back electrode on the p+ layer.

9. A method according to claim 8 further comprising the step of adding an antireflection layer over at least a portion of the n+ layer.

10. A method of manufacturing a solar cell comprising the steps of:
    providing a p-type substrate having first and second major surfaces;

forming a layer of amorphous silicon on the first surface;
coating the amorphous silicon layer with an alcohol solution of ester silicate;
drying the alcohol ester solution;
first laser beam irradiating the coated amorphous silicon layer to at least partially melt the amorphous silicon layer causing phosphorus to be absorbed and diffused into the amorphous silicon layer thereby forming an $n^+$ layer;
simultaneous with said laser beam irradiating, indirectly heating the coated amorphous layer to at least partially transform it into a stable antireflection layer;
applying an aluminum paste on the second surface of the substrate;
drying the aluminum paste;
second laser beam irradiating the dried aluminum paste layer to form a $p^+$ layer;
removing any excess aluminum paste;
photoresist etching the antireflection layer to form openings exposing portions of the $n^+$ layer;
plating metal into the openings in contact with the exposed portions of the $n^+$ layer to form a front electrode; and
plating metal onto the $p^+$ layer to form a back electrode.

11. A method according to claim 10 wherein the first mentioned plating step comprises the sequential steps of electroless nickel plating, copper electro-plating, and electroless nickel plating.

12. A method according to claim 10 wherein the second mentioned plating step comprises the sequential steps of electroless nickel plating, copper electroplating, and electroless nickel plating.

* * * * *